United States Patent [19]

I'Anson

[11] 3,746,157

[45] July 17, 1973

[54] PROTECTIVE CARRIER FOR SEMICONDUCTOR DEVICES

[75] Inventor: Thomas C. I'Anson, Phoenix, Ariz.

[73] Assignee: Motorola, Inc., Franklin Park, Ill.

[22] Filed: Oct. 26, 1971

[21] Appl. No.: 192,514

[52] U.S. Cl. ...... 206/46 ED, 206/65 F, 174/DIG. 3, 339/17 CF

[51] Int. Cl. ........................ B65d 73/02, B65d 85/00

[58] Field of Search ...................... 206/65 F, 46 ED, 206/46 H, 46 R, 1 R; 174/DIG. 3, 52 R; 339/17 CF, 174; 324/2 R

[56] References Cited

UNITED STATES PATENTS

| | | | |
|---|---|---|---|
| 3,377,514 | 4/1968 | Ruehlemann et al. | 339/17 CF |
| 3,648,108 | 1/1971 | Bailey | 174/DIG. 3 |
| 3,297,974 | 1/1967 | Pittman | 206/65 F |
| 3,409,861 | 11/1968 | Barnes et al. | 339/17 CF |
| 3,454,921 | 7/1969 | Coleman et al. | 206/1 R |

*Primary Examiner*—William T. Dixson, Jr.
*Attorney*—Foorman L. Mueller

[57] ABSTRACT

A two-piece carrier for flat-pack integrated circuit semi-conductor devices includes a nonconductive base member with a recess for the body of a semiconductor device and a plurality of lead receiving slots. A retaining clip placed over the semiconductor device has lead engaging members on each side for retaining and holding the semiconductor device in the carrier. The lead engaging members are plated with aluminum to short the leads of the semiconductor device during shipping and handling, but the retaining clip is loosely retained. When the carrier is inverted and placed on a conventional test fixture, the leads of the semiconductor device are engaged by the contacts of the test fixture and pressed onto the base member, with the retaining clip dropping away from contact with the leads.

7 Claims, 9 Drawing Figures

PROTECTIVE CARRIER FOR SEMICONDUCTOR DEVICES

BACKGROUND OF THE INVENTION

Plastic carriers have been developed for facilitating handling and providing protection during handling and testing of multi-lead flat-pack integrated circuit semiconductor packages. Such carriers include a main body portion made of nonconductive material, such as plastic, with a recess for accommodating the body of the integrated circuit package, and the leads extending from the sides of the package body are separated and retained in place by partitions forming a number of lead receiving channels on opposite sides of the recess. When the semiconductor package is in place on the base member, a nonconductive retaining clip is placed over it. The clip includes depending members on each side of the semiconductor package bridging the leads to hold the package in place with the leads in the channels. The carrier, with the integrated circuit package in place, then can be easily handled and placed within test fixtures which accommodate the carrier for testing of the integrated circuit package.

The plastic carriers also are used as disposable shipping containers to provide protection against physical damage to the integrated circuit packages which are carried in them. A problem in the use of such carriers for shipping containers, however, has arisen with respect to the shipping of integrated circuit packages including high gain devices in the circuits such as MOSFET devices in which the field-effect transistors in the circuits provide very high gain. When the leads on such a high gain package are subjected to static electric discharges, it is possible to destroy the input gates or junctions of semiconductor devices in the integrated circuit. It has been found that static charges sufficient to destroy the semiconductor devices can take place if the circuit packages are being shipped in a closed truck driving through a lightening storm.

When a large number of expensive high gain integrated circuit packages are shipped, they often are placed in trays, 100 to 500 to a tray, and a sheet of graphite-impregnated plastic sponge or the like is pressed over the devices in the tray in an attempt to short circuit the leads of the device so that static electric sparking or discharges between leads cannot take place. The graphite-impregnated foam is quite expensive and does not necessarily insure good short circuit interconnections of the leads of the packages.

SUMMARY OF THE INVENTION

Accordingly, it is an object of this invention to provide an improved carrier for semiconductor devices.

It is another object of this invention to provide a carrier for a flat-pack integrated circuit package which permits testing of the package within the carrier while also providing short circuit interconnections between the leads of the semiconductor package during shipping.

In accordance with a preferred embodiment of this invention, a carrier for semiconductor devices of the flat-pack type includes a base member made of nonconductive material with a recess in it to accommodate the package body of the semiconductor device. The base member has a support surface on at least one side of the recess to support leads extending from the body of the semiconductor device and these leads are separated in and retained by channels formed by a number of partitions which extend upwardly from the base member. These partitions are spaced from the recess an amount sufficient to expose a portion of all of the leads of the semiconductor device which is held in place by a snap-in retaining clip, the underside of which is plated with a conductive material, such as aluminum. When the retaining clip is in place, a portion of its undersurface bridges the conductors of the semiconductor device, shorting them to one another.

In an inverted position, the carrier may be placed on a standard test fixture, with the contacts of the test fixture pressing the leads of the semiconductor device against the support surface of the base member. The retaining clip is somewhat loosely retained in the base member; and when the device is placed on the test fixture, the surface of the retaining clip used to short the leads to one another drops away from the leads. This removes the short circuit so that normal testing without removal of the clip is possible.

In another embodiment of the invention, a spring is located to urge the body of the semiconductor device toward the retaining clip to cause the leads to engage the lower surface of the clip. Placement of the assembly in a test fixture then is made with sufficient force to overcome this spring bias, and testing of the semiconductor device can be accomplished without removal of the clip.

DETAILED DESCRIPTION

Figure 1:
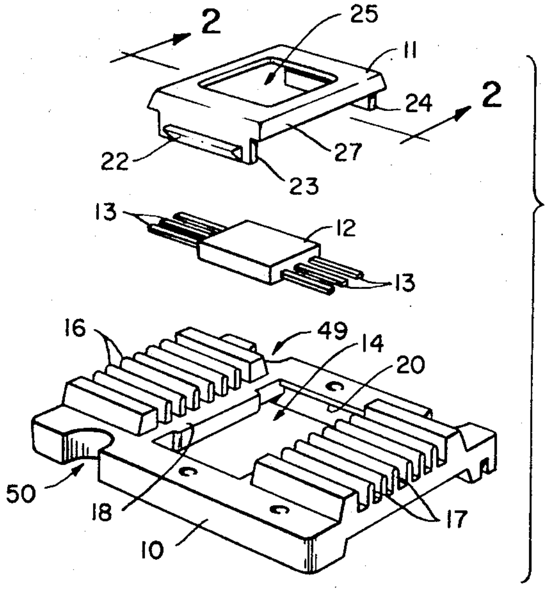
FIG. 1 is an exploded view of a preferred embodiment of the invention illustrating the manner in which the parts fit together to retain a semiconductor device.

In the drawings, the same reference numbers are used throughout the several views to designate the same or similar components. Referring first to FIG. 1, there is shown an exploded view of a typical carrier for protecting the leads of a flat-pack, integrated circuit, semiconductor package against damage during handling and testing. The carrier includes a base member 10 and a retaining clip 11 for holding a flat-pack semiconductor package or device 12 in place during handling, testing, and shipping. Since it is desirable to enable testing of the semiconductor package 12 while it is held in the carrier, the base portion 10 preferably is molded of a nonconductive plastic material and includes a recess 14 having dimensions sufficient to accommodate packages 12 of various sizes. The package 12 which is illustrated is a six-lead package with three leads 13 extending from each of two opposite sides. The carrier 10 which is illustrated is capable of accommodating a fourteen-lead package, having seven leads extending from each side, and of course, may accommodate semiconductor packages having from one to seven leads on either side of the main package body. The particular package size which is shown is merely employed for purpose of illustration.

Figure 3:
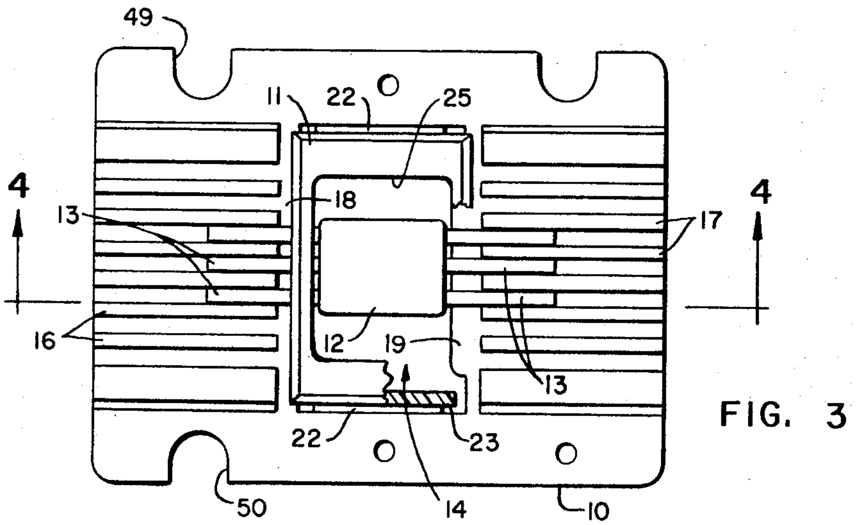
FIG. 3 is a top view of a complete assembly of the type shown in FIG 1.

When the body of the package 12 is placed in the recess 14, the leads 13 extending from each side of the package body are retained in guide channels formed by parallel upward projections 16 and 17 on opposite sides of the recess 14. The projections 16 and 17 do not extend to the edges of the recess 14, but are spaced from the edges by lead support surfaces or shelves 18 and 19. As most clearly seen in FIG. 3, the leads 13 extending from the ends of the package 12 overlie these support surfaces 18 and 19.

On the two sides of the recess 14 which interconnect the ends including the projections 16 and 17 and the support surfaces 18 and 19, there is an undercut portion (most clearly shown in FIG. 6) forming a shoulder 20 which is engaged by one of a pair of cooperating projections 22 located on each of two side members 23 and 24 of the generally U-shaped resilient retaining clip 11. As most clearly shown in FIG. 6, the lower side of each of the projections 22 is a camming surface which causes each of the depending side members 23 and 24 of the retaining clip to be cammed inwardly in response to a downward pressure of the retaining clip 11 into the recess 14. Once the projections 22 pass the underside of the shoulders 20, the sides 23 and 24 of the resilient retaining clip 11 spring outwardly to the position shown in FIG. 6.

A recess 25 is provided in the upper surface of the retaining clip 11 to accommodate the body portion of the package 12 and to permit visual inspection of the package and any indicia appearing on it.

Interconnecting each of the downwardly depending sides 23 and 24 are shorter depending lead engaging members 27 and 28 which provide mechanical rigidity for the retaining clip 11 and which also have lower lead engaging surfaces 29 and 30, respectively. With the projections 22 located just beneath and engaging the shoulders 20 of the base member 10, there is sufficient clearance between the lead engaging surfaces 29 and 30 and the tops of the leads 13 extending from the integrated circuit package, so that the leads 13 are not engaged by the surfaces 29 and 30. This clearance is most clearly shown in FIGS. 4 and 6. It should be noted, however, that the retaining clip 11 is only loosely retained in place by the shoulders 20; so that normally gravity causes the retaining clip 20 to drop to a point where the surfaces 29 and 30 engage the leads 13. The illustration shown in FIGS. 4 and 6 merely is made in order to show the clearance which is present.

Figure 2:
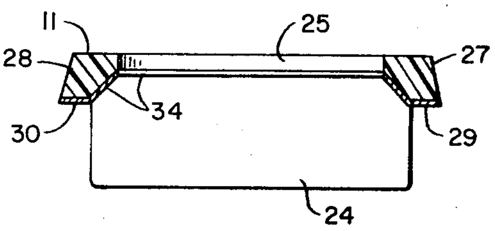
FIG. 2 is a cross-section taken along the line 2—2 of FIG. 1.

To short circuit the leads 13 to one another, the lower side of the retaining clip 11, including the lead engaging surfaces 29 and 30, is plated with a suitable low-ohmic conductive material 34, such as aluminum or the like (most clearly shown in FIG. 2). The conductive material 34 extends over each of the lead engaging surfaces 29 and 30 and across the entire lower side of the clip 11 to conductively interconnect both of the lead engaging surfaces 29 and 30 with one another. Thus, when the retaining clip 11 is in place and drops or is pushed to the point where the conductive material on the lead engaging surfaces 29 and 30 engages the leads 13 of the semiconductor package 12, the leads 13 are shorted to one another. This protects the devices in the semiconductor package 12 from static electric discharges between leads.

Figures 4, 5:
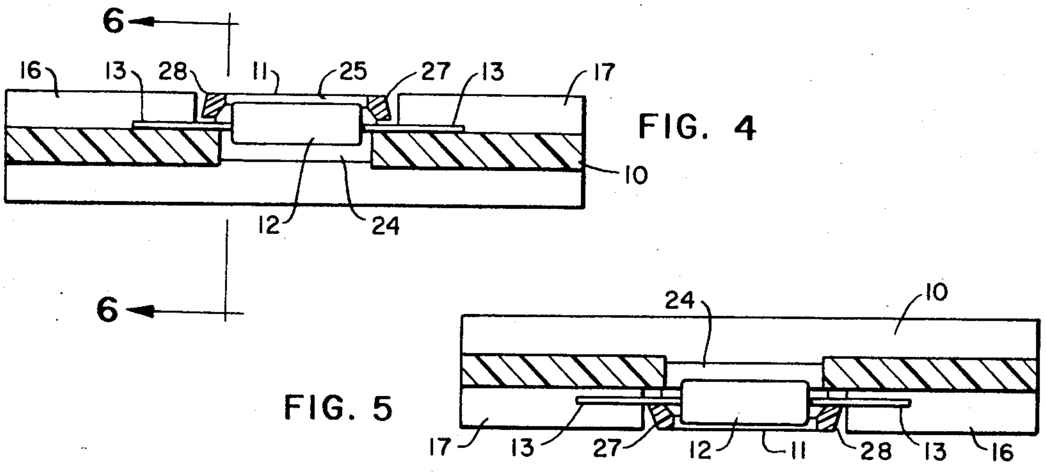
FIG. 4 is a view taken along the cross-section 4—4 of FIG. 3.
FIG. 5 is an inverted view of the cross-section shown in FIG. 4.
Figure 6:
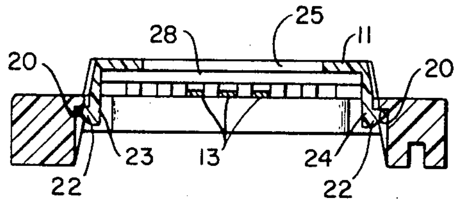
FIG. 6 is a view taken along the section line 6—6 in FIG. 4.

With the carrier in the upright position shown in FIGS. 1, 4 and 6, gravity is sufficient to cause the retaining clip 11 to drop to the point where the conductive material 34 on the lead engaging surfaces 29 and 30 shorts the leads 13. If the carrier is inverted as shown in FIG. 5, the shoulders 20 prevent the clip 11 from moving outwardly beyond the point shown in FIG. 5; and the weight of the package 12 causes it to fall to the position shown in FIG. 5 with the leads engaging the lead engaging surfaces 29 and 30. Thus, protection is provided with the carrier being transported in either its upright or inverted position.

Figure 7:
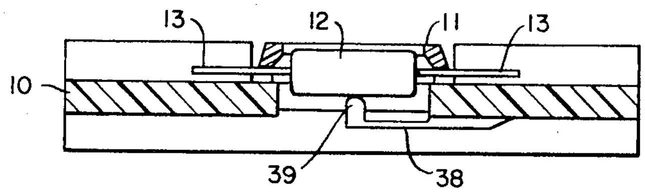
FIG. 7 illustrates another embodiment of the invention.

To insure that the leads 13 continuously engage the lead engaging surfaces 29 and 30 during shipping, even though the carrier is subjected to bouncing, the base member 10 (as shown in FIG. 7) may be provided with an integrally molded spring finger 38 carrying a projection 39 extending into the recess 14 for engagement with the body of a semiconductor package 12. The spring 38 then urges the body of the semiconductor package 12 upwardly, as viewed in FIG. 7, so that the leads 13 engage the short circuiting conductive material on the lead engaging surfaces 29 and 30 of the retaining clip.

Figure 8:
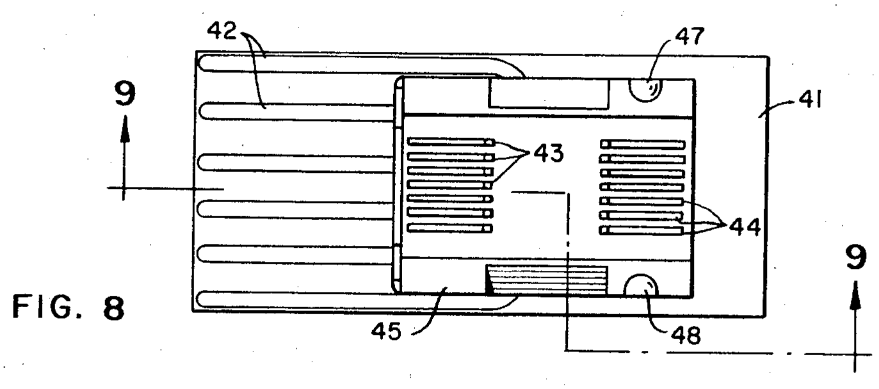
FIGS. 8 and 9 illustrate a test fixture with an assembly of the type shown in FIGS. 1 and 3 placed thereon.
Figure 9:
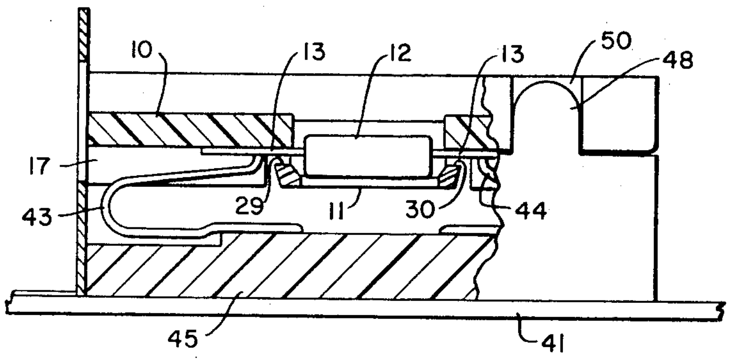

With either of the embodiments shown in FIGS. 1 to 6 or shown in FIG. 7 being utilized, the conductive material on the surfaces 29 and 30 of the retaining clip 11 does not prevent testing of the semiconductor package 12 retained in the carrier in a normal test fixture. Such a conventional test fixture is illustrated in FIGS. 8 and 9 and includes a printed circuit base 41 having a plurality of input and output leads 42 formed on it for engagement by suitable connectors. These leads are connected to a number of spring contacts 43 and 44 mounted in a support block 45 and are located on opposite sides of an integrated package receiving area. The spacing between adjacent ones of the contacts 43 and 44 is selected to cause these contacts to fit within the channels, formed between the projections 16 and 17, respectively. Alignment of the contacts 43 and 44 with these channels is insured by a pair of upright locating pins 47 and 48 on the test fixture which cooperate with corresponding notches or cut-outs 49 and 50, respectively, on the base member 10 of the carrier. When the base member 10 of the carrier is pressed downwardly onto the test fixture, the spring contacts 43 and 44 flex and pass the leads 13 against the bottoms of the channels formed between the projections 16 and 17. With the carrier in its inverted position, gravity causes the retaining clip 11 to fall to the position shown in FIG. 9, in which the projections 22 engage the shoulders 20 and cause the lead engaging surfaces 29 and 30 to fall out of engagement with the leads 13 of the semiconductor package 12. Thus, normal testing of the semiconductor package 12 can be effected even though the lead engaging surfaces 29 and 30 of the retaining clip 11 are plated with or made of conductive material. If the embodiment shown in FIG. 7 is used, sufficient force must be used in pressing the base member 10 down onto the spring contacts 43 and 44 to overcome the spring pressure of the spring 38.

Although the foregoing description has been directed to the use of a retaining clip 11 made of a resilient plastic material which is coated or plated with a metallic conductive material, the retaining clip 11 could be made entirely of a conductive material if desired. Its function would be the same as that described above. By forming the lead engaging surfaces of the retaining clip of the shipping carrier of conductive material, it is possible to short circuit the leads of high gain devices included in an integrated circuit package during shipping and handling while still permitting testing of the package in the carrier without removal and without modification of the standard test fixture. As a result, damage of integrated circuit packages due to static electrical discharges during shipping are minimized without modification of the physical dimensions of the shipping carrier or of the test fixtures with which it is used.

I claim:

1. A carrier for semiconductor devices of the flat-pack type having a plurality of leads extending from at least one side of a package body, said carrier including in combination:

a base member made of nonconductive material having a recess therein for receiving the package body of a flat-pack semiconductor device, said base member having a support surface adjacent at least one side of the recess for supporting leads extending from such a semiconductor device, a plurality of spaced, elongated, partition members extending outwardly from said base member at right angles to the plane of the support surface, the spacing between and the width of said partition members forming channels of sufficient width to receive and separate the leads of such semiconductor package, the ends of said partition members located to expose a portion of such leads on said support surface, and retaining clip holding means in said base member; and a retaining clip having means for engaging said retaining clip holding means of said base member, said retaining clip having a recess therein for receiving the package body of a semiconductor device and having at least one lead engaging member on a side thereof overlying said support surface of said base member for engaging exposed portions of leads overlying said support surface, the location of said holding means in said base member and the position of said engaging means on said retaining clip permitting movement of said lead engaging member out of engagement with such leads with said retaining clip being retained by engagement of said engaging means with said holding means, and at least a lead engaging surface of said lead engaging member being made of conductive material.

2. The combination according to claim 1 wherein said retaining clip is made of conductive material.

3. The combination according to claim 1 wherein said retaining clip is made of nonconductive material with the lead engaging surface of said lead engaging member being coated with a low ohmic material.

4. The combination according to claim 1 wherein the recess in said base member is an opening extending through said base member, with said base member further including spring means attached thereto and having a portion extending at least partially into the opening in said base member from a side opposite the lead support surface for engaging the package body of a semiconductor device placed in such opening and urging the leads of such semiconductor device into engagement with said lead engaging member of said retaining clip.

5. The combination according to claim 1 wherein said base member includes support surfaces on diametrically opposite sides of the recess and includes a plurality of spaced elongated partition members on opposite sides of said recess extending outwardly from said base member at right angles to the support surfaces and aligned with one another to form aligned lead receiving channels to permit said carrier to carry semiconductor devices of the flat-pack type having a plurality of leads extending from opposite sides thereof, the lead support surfaces being immediately adjacent opposite edges of the recess between the recess and said partition members on each side thereof; and said retaining clip has lead engaging members on opposite sides of the package body receiving recess therein for engaging exposed portions of leads on opposite sides of semiconductor devices on each of said support surfaces of said base member, each of said lead engaging members having at least the lead engaging surface thereof made of conductive material.

6. The combination according to claim 5 in which the recess in said base member is a substantially rectangular recess with said clip holding means comprising shoulders on the sides of the recess interconnecting said support surfaces, said retaining clip is a substantially U-shaped member made of resilient material, the base of the U including the retaining clip recess and the two sides of the U having engaging projections thereon for matingly engaging with said shoulders and wherein said lead engaging members depend from the surface of said clip having said recess along the edges of the recess at right angles to the said shoulder engaging projections, said engaging projections permitting said retaining clip to be loosely retained in said base member with cooperation of said shoulders and said engaging projections restraining movement away from said support surface of said base member to a point further than the distance said partition members extend outwardly from said plane of said support surface while permitting clearance between leads on said support surface and the lead engaging surface of said lead engaging members.

7. The combination according to claim 6 wherein said clip is made of resilient nonconductive material with at least said lead engaging surfaces being plated with conductive material.

* * * * *